United States Patent
Liu et al.

(10) Patent No.: US 10,608,200 B2
(45) Date of Patent: Mar. 31, 2020

(54) FLEXIBLE DISPLAY MODULE AND DISPLAY DEVICE

(71) Applicant: BOE TECHNOLOGY GROUP CO., LTD., Beijing (CN)

(72) Inventors: Lu Liu, Beijing (CN); Shan-Chen Kao, Beijing (CN); Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 194 days.

(21) Appl. No.: 15/580,349

(22) PCT Filed: Jun. 21, 2017

(86) PCT No.: PCT/CN2017/089360
§ 371 (c)(1),
(2) Date: Dec. 7, 2017

(87) PCT Pub. No.: WO2018/103300
PCT Pub. Date: Jun. 14, 2018

(65) Prior Publication Data
US 2018/0301660 A1 Oct. 18, 2018

(30) Foreign Application Priority Data
Dec. 9, 2016 (CN) .......................... 2016 1 1132175

(51) Int. Cl.
| | | |
|---|---|---|
| B32B 7/02 | (2019.01) | |
| H01L 51/52 | (2006.01) | |
| B32B 7/12 | (2006.01) | |
| B32B 17/06 | (2006.01) | |
| G09F 9/30 | (2006.01) | |
| B32B 27/20 | (2006.01) | |
| H01L 51/00 | (2006.01) | |
| H01L 27/32 | (2006.01) | |

(52) U.S. Cl.
CPC ............ *H01L 51/5253* (2013.01); *B32B 7/12* (2013.01); *B32B 17/06* (2013.01); *B32B 27/20* (2013.01); *G09F 9/301* (2013.01); *B32B 2457/208* (2013.01); *H01L 27/323* (2013.01); *H01L 51/0097* (2013.01); *H01L 2251/5338* (2013.01)

(58) Field of Classification Search
CPC ... B32B 17/06; B32B 2457/208; B32B 27/20; B32B 7/12; G09F 9/301; H01L 2251/5338; H01L 27/323; H01L 51/0097; H01L 51/5253
See application file for complete search history.

(56) References Cited

U.S. PATENT DOCUMENTS

| | | |
|---|---|---|
| 9,029,846 B2 | 5/2015 | Song et al. |
| 2014/0367644 A1 | 12/2014 | Song et al. |
| 2016/0155967 A1 | 6/2016 | Lee et al. |

FOREIGN PATENT DOCUMENTS

| | | |
|---|---|---|
| AU | 2015355047 A1 | 6/2017 |
| CN | 104241316 A | 12/2014 |
| CN | 105977277 A | 9/2016 |
| CN | 106155399 A | 11/2016 |
| CN | 106710449 A | 5/2017 |
| WO | 2016085182 A1 | 6/2016 |

OTHER PUBLICATIONS

First Office Action for Chinese Patent Application No. 2016111321753 dated Oct. 9, 2017.
Search Report for International Application No. PCT/CN2017/089360 dated Aug. 24, 2017.

*Primary Examiner* — Lawrence D Ferguson
(74) *Attorney, Agent, or Firm* — Calfee, Halter & Griswold LLP

(57) ABSTRACT

A flexible display module includes a flexible substrate, a display layer disposed on the flexible substrate, a protective layer disposed on the display layer, a strengthening layer disposed between the display layer and the protective layer, the modulus of the strengthening layer being greater than or equal to the modulus of any of the layers in the flexible display module.

16 Claims, 5 Drawing Sheets

| Protective layer | — 300 |
| --- | --- |
| Touch layer | — 600 |
| Strengthening layer | — 400 |
| Polarizing layer | — 500 |
| Display layer | — 200 |
| Flexible substrate | — 100 |
| Base film and other protective layers | — 700 |

Fig. 3b

| Protective layer | — 300 |
| --- | --- |
| Touch layer | — 600 |
| Polarizing layer | — 500 |
| Strengthening layer | — 400 |
| Display layer | — 200 |
| Flexible substrate | — 100 |
| Base film and other protective layers | — 700 |

Fig. 3c

FLEXIBLE DISPLAY MODULE AND DISPLAY DEVICE

CROSS REFERENCE

The present application is based on International Application No. PCT/CN2017/089360, filed on Jun. 21, 2017, which is based upon and claims priority to Chinese Patent Application No. 201611132175.3 filed on Dec. 9, 2016, titled "FLEXIBLE DISPLAY MODULE AND DISPLAY DEVICE", and the entire contents thereof are incorporated herein by reference.

TECHNICAL FIELD

The present disclosure relates to the field of flexible display technology, and more particularly, to a flexible display module and a display device.

BACKGROUND

The present flexible display module consists of a multi-layer film structure, and a general flexible display module includes, arranged sequentially on a flexible substrate, a display layer (including an OLED display device and a pixel circuit), a circularly polarized light layer (C-POL), a touch layer, a protective layer, and a base film disposed on the back of the flexible substrate, etc. Among them, the protective layer plays a role in protecting the overall flexible display module.

In order to meet the bending characteristics of the flexible display module, there is a limit to the thickness of the flexible protective layer of the flexible display module, thereby affecting the protective properties of the protective layer to the underlying OLED device. In the ball drop test, although the protective layer is not damaged, the OLED device in the flexible display module may have failures which show up as extremely large black spots. As the thickness of the protective layer increases, the protection characteristics of the OLED device will be improved, but the bending characteristics of the flexible display module are affected.

Therefore, how to enhance the reliability of the flexible display module while maintaining the bending characteristics of the flexible display module is a technical problem that needs to be solved in the field.

It should be noted that, information disclosed in the above background portion is provided only for better understanding of the background of the present disclosure, and thus it may contain information that does not form the prior art known by those ordinary skilled in the art.

SUMMARY

The embodiments of the present disclosure provide a flexible display module and a display device.

The embodiments of the present disclosure provide a flexible display module, including a flexible substrate, a display layer disposed on the flexible substrate, a protective layer disposed on the display layer, and a strengthening layer disposed between the display layer and the protective layer, the modulus of the strengthening layer being greater than or equal to the modulus of any of the layers in the flexible display module.

In one impossible embodiment, the flexible display module provided by the embodiments of the present disclosure further includes a polarizing layer disposed between the display layer and the protective layer, the strengthening layer being adjacent to the display layer.

In one impossible embodiment, the flexible display module provided by the embodiments of the present disclosure further includes a touch layer disposed between the polarizing layer and the protective layer, or a touch layer disposed between the polarizing layer and the display layer.

In one impossible embodiment, in the flexible display module provided by the embodiments of the present disclosure, thickness of the strengthening layer ranges from 10 μm to 150 μm.

In one impossible embodiment, in the flexible display module provided by the embodiments of the present disclosure, the thickness of the strengthening layer ranges from 30 μm to 120 μm.

In one impossible embodiment, in the flexible display module provided by the embodiments of the present disclosure, the thickness of the strengthening layer ranges from 30 μm to 100 μm.

In one impossible embodiment, in the flexible display module provided by the embodiments of the present disclosure, modulus of the strengthening layer ranges from 10 Gpa to 200 Gpa.

In one impossible embodiment, in the flexible display module provided by the embodiments of the present disclosure, material of the strengthening layer is soft glass or inorganic fiber-reinforced organic material.

In one impossible embodiment, in the flexible display module provided by the embodiments of the present disclosure, transmittance of the strengthening layer is greater than 90%.

In one impossible embodiment, in the flexible display module provided by the embodiments of the present disclosure, the strengthening layer is fixed to an adjacent layer by a glue material.

As another aspect, the embodiments of the present disclosure further provide a display device including the above flexible display module provided by embodiments of the present disclosure.

BRIEF DESCRIPTION OF THE DRAWINGS

FIGS. 3a to 3f are yet another structural schematic diagrams of flexible display modules provided by embodiments of the present disclosure, respectively.

DETAILED DESCRIPTION

The specific implementing manners of a flexible display module and a display device provided by embodiments of the present disclosure will be described in detail in conjunction with the accompanying drawings.

The thickness and shape of each layer in the accompanying drawings do not reflect the true scale of the flexible display module, the purpose of which is merely illustrative of the contents of the present disclosure.

Figure 1:
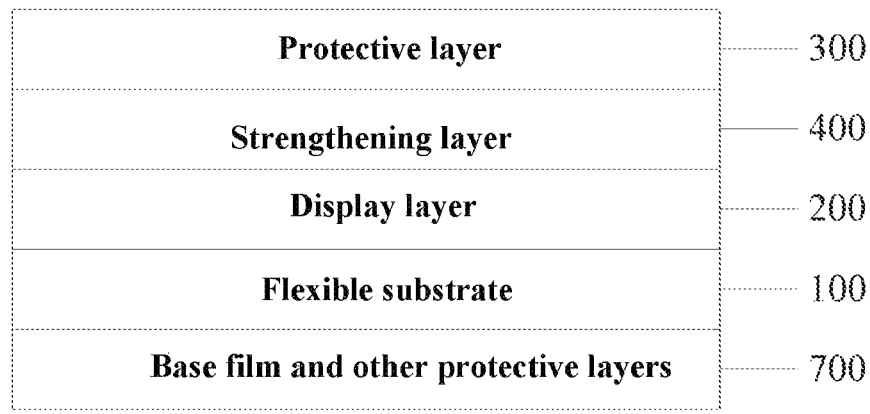
FIG. 1 is a structural schematic diagram of a flexible display module provided by embodiments of the present disclosure.

The embodiments of the present disclosure provide a flexible display module. As shown in FIG. 1, the flexible display module includes: a flexible substrate 100, a display layer 200 disposed on the flexible substrate 100, and a protective layer 300 disposed on the display layer 200. The flexible display module further includes a strengthening layer 400 disposed between the display layer 200 and the protective layer 300, the modulus of the strengthening layer 400 being greater than or equal to the modulus of any of the layers in the flexible display module.

In the flexible display module provided by the embodiment of the present disclosure, the strengthening layer 400 is inserted between the display layer 200 and the protective layer 300, and the modulus of the strengthening layer 400 is greater than or equal to that of any of the layers in the flexible display module, so that the strained neutral layer in the flexible display module is pulled to the vicinity of the strengthening layer 400. Since the display layer 200 is closer to the strengthening layer 400, it is less stressed, so that the bending characteristic of the display layer 200 can be enhanced. Thus, the reliability of the flexible display module in the ball drop test is improved while the thickness of the protective layer 300 does not affect the bending characteristics.

In specific implementation, in the above flexible display module provided by the embodiments of the present disclosure, the material of the protective layer 300 may be a plastic substrate or a glass substrate, which is not limited herein. The thickness of the protective layer can be between 5 μm and 300 μm.

Figure 2A:
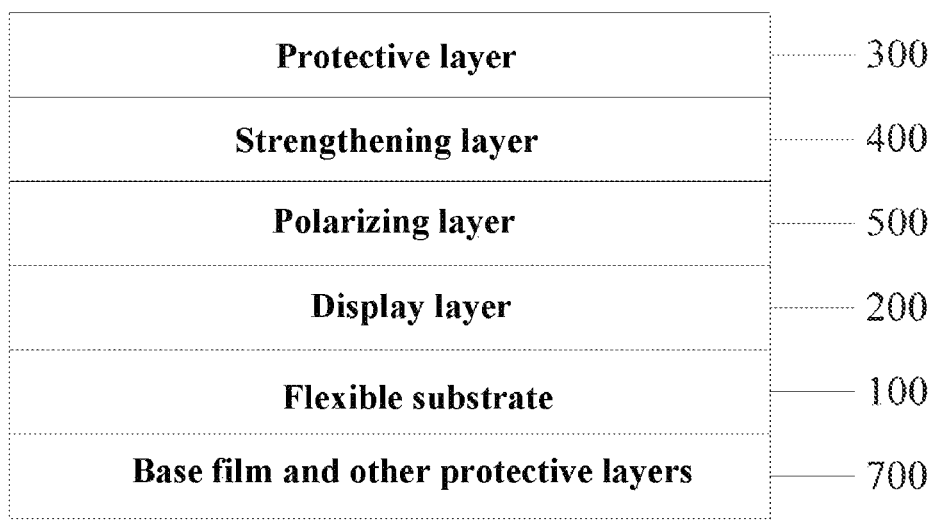
FIGS. 2a and 2b are another structural schematic diagrams of flexible display modules provided by embodiments of the present disclosure, respectively.
Figure 2B:
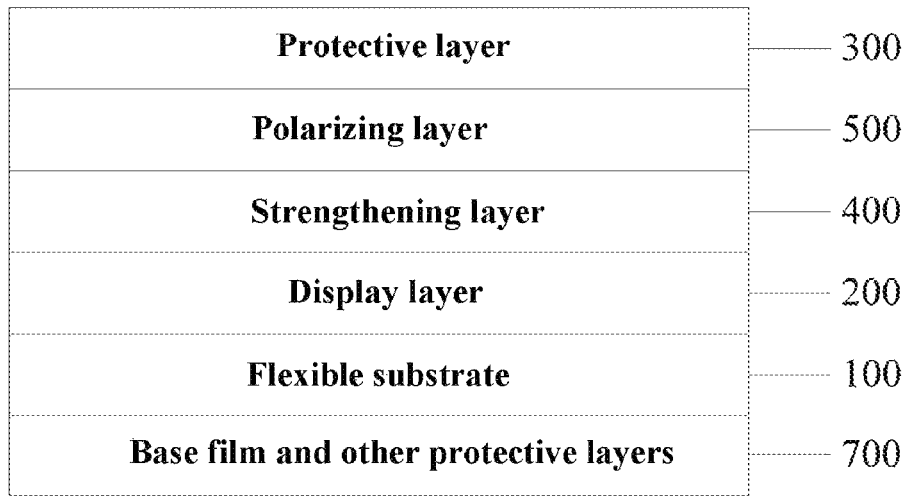

In specific implementation, as shown in FIGS. 2a and 2b, the above flexible display module provided by the embodiments of the present disclosure also includes a polarizing layer 500 disposed between the display layer 200 and the protective layer 300. Generally, a circular polarizing layer is used. In specific implementation, as shown in FIG. 2a, the strengthening layer 400 may be disposed between the protective layer 300 and the polarizing layer 500. Preferably, as shown in FIG. 2b, the strengthening layer 400 may also be disposed between the display layer 200 and the polarizing layer 500, that is, the strengthening layer 400 is adjacent to the display layer 200. Such a structure can reduce the stress imposed on the display layer 200 when it is bent, which helps to prevent the display layer 200 from being damaged during the bending.

Figure 3A:
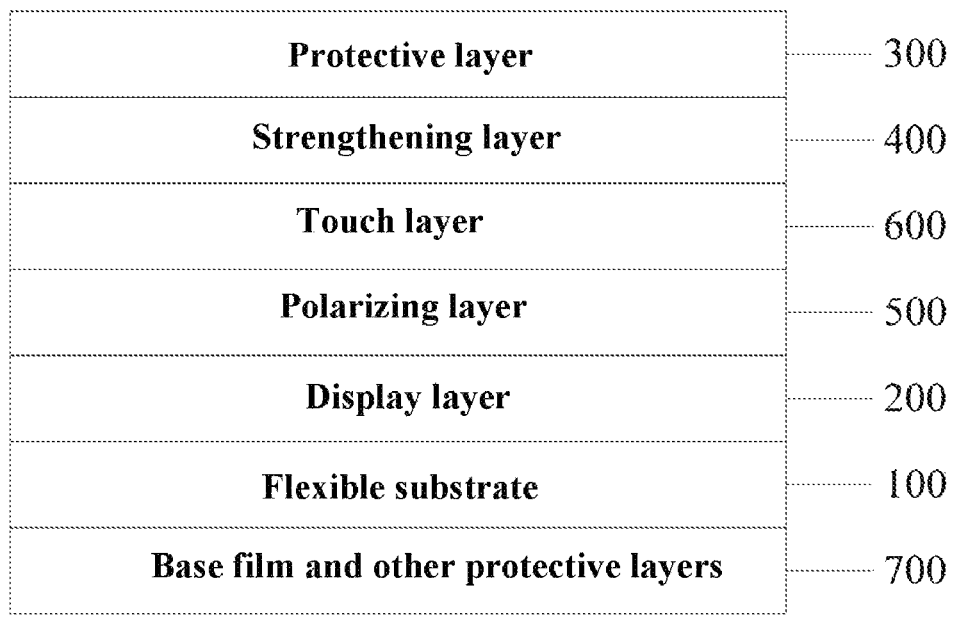

In specific implementation, the above flexible display module provided by the embodiments of the present disclosure further includes a touch layer 600. As shown in FIGS. 3a to 3c, the touch layer 600 can be disposed between the polarizing layer 500 and the protective layer 300. Alternatively, as shown in FIGS. 3d to 3f, the touch layer 600 can be disposed between the polarizing layer 500 and the display layer 200.

Specially, when the touch layer 600 is disposed between the polarizing layer 500 and the protective layer 300, the strengthening layer 400 may be disposed between the protective layer 300 and the touch layer 600 as shown in FIG. 3a, or the strengthening layer 400 may be disposed between the touch layer 600 and the polarizing layer 500 as shown in FIG. 3b. In one embodiment, as shown in FIG. 3c, the strengthening layer 400 may also be disposed between the polarizing layer 500 and the display layer 200, that is, the strengthening layer 400 is adjacent to the display layer 200. Such a structure can reduce the stress imposed on the display layer 200 when it is bent, which helps to prevent the display layer 200 from being damaged during the bending.

Figure 3D:
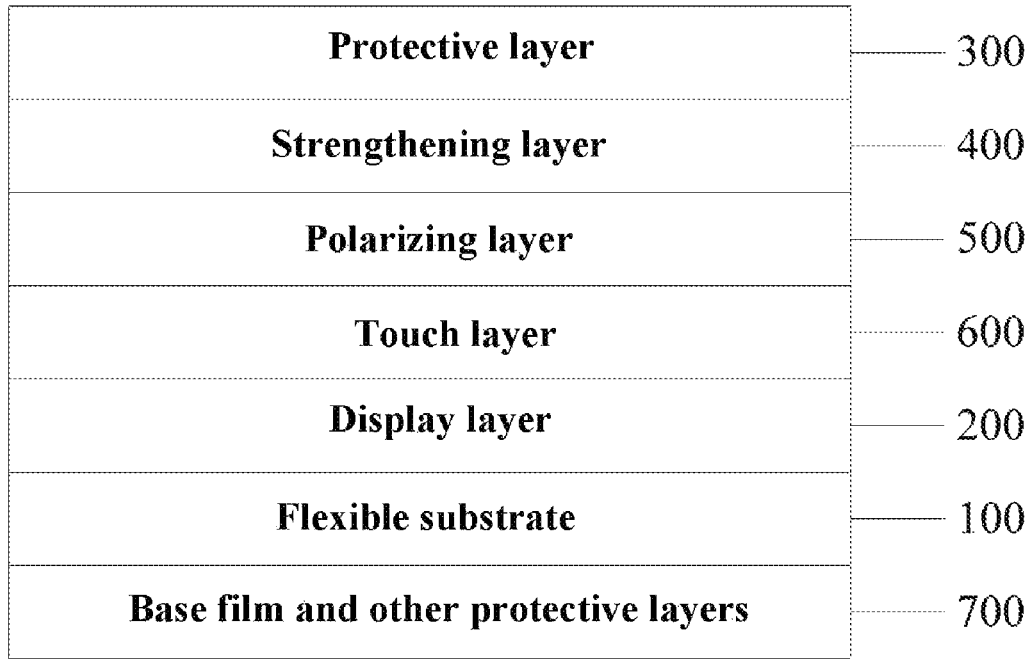
Figure 3E:
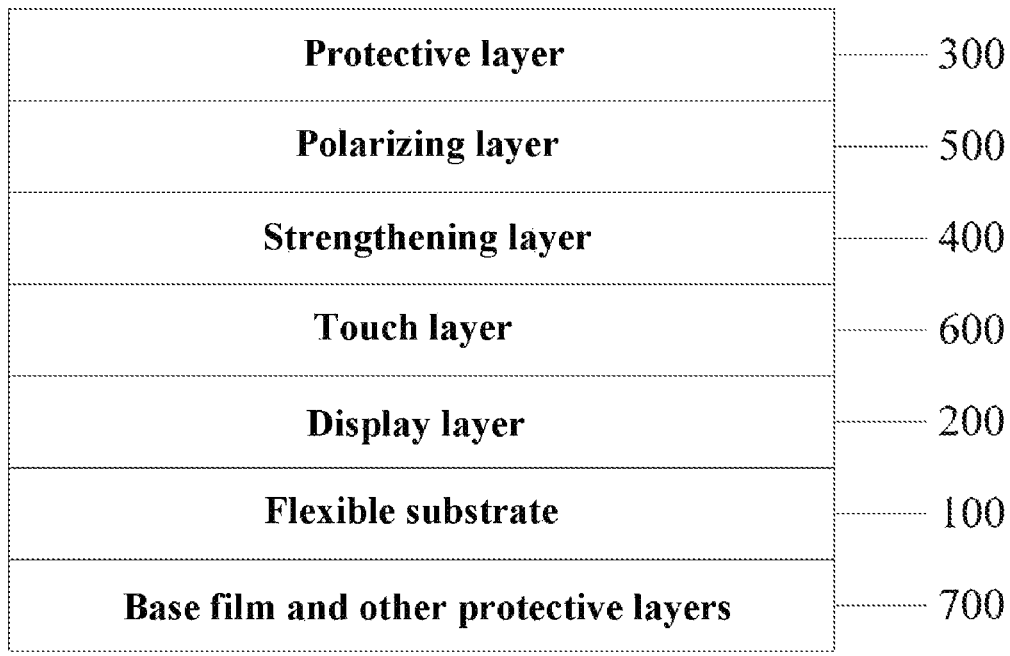
Figure 3F:
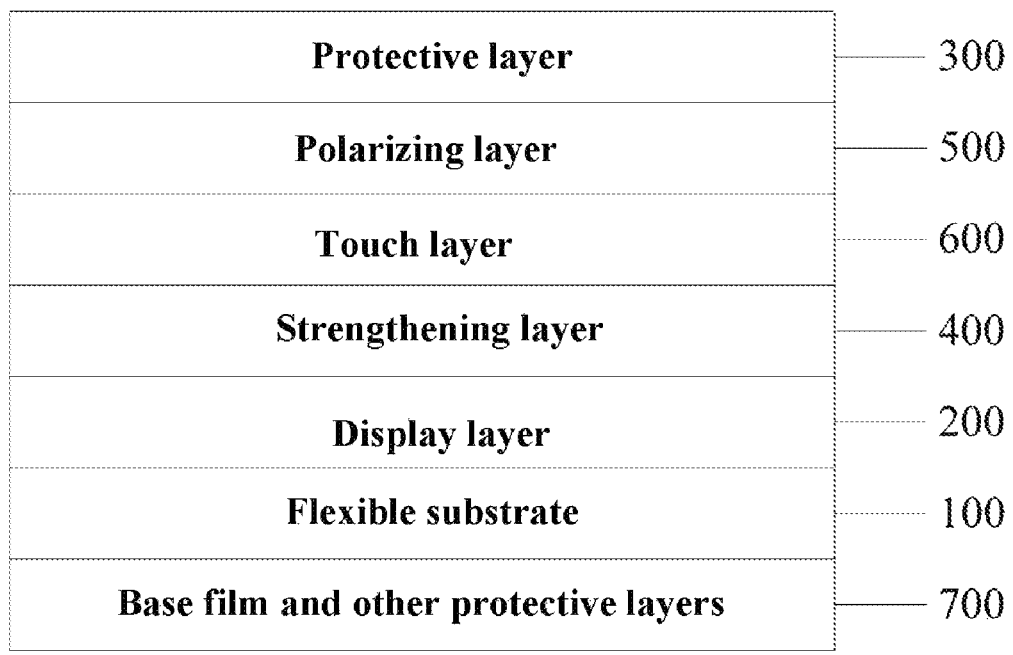

Specifically, when the touch layer 600 is disposed between the polarizing layer 500 and the display layer 200, the strengthening layer 400 may be disposed between the protective layer 300 and the polarizing layer 500 as shown in FIG. 3d, or the strengthening layer 400 may be disposed between the polarizing layer 500 and the touch layer 600 as shown in FIG. 3e. In one embodiment, as shown in FIG. 3f, the strengthening layer 400 may also be disposed between the touch layer 600 and the display layer 200, that is, the strengthening layer 400 is adjacent to the display layer 200 and the strengthening layer 400 is also adjacent to the touch layer 600. Such a structure can reduce the stress imposed on the display layer 200 and the touch layer 600 when they are bent, which helps to prevent the display layer 200 and the touch layer 600 from being damaged during the bending.

In addition, as shown in FIG. 1, the above flexible display module provided by the embodiment of the present disclosure also includes a base film and other protective layers 700 provided on the back surface of the flexible substrate 100, which is not limited herein.

In specific implementation, in the above flexible display module provided by the embodiment of the present disclosure, the thickness of the strengthening layer 400 ranges from 10 μm to 150 μm.

In one embodiment, in the above flexible display module provided in the embodiment of the present disclosure, the thickness of the strengthening layer 400 ranges from 30 μm to 120 μm.

In one embodiment, in the above flexible display module provided in the embodiment of the present disclosure, the thickness of the strengthening layer 400 ranges from 30 μm to 100 μm.

In specific implementation, in the above flexible display module provided by the embodiment of the present disclosure, it is required that the modulus of the strengthening layer 400 ranges from 10 Gpa to 200 Gpa to be higher than that of other layers in the flexible display module.

In specific implementation, in the above flexible display module provided by the embodiment of the present disclosure, the material of the strengthening layer 400 may be a high modulus material such as soft glass or inorganic fiber-reinforced organic material. Other materials with high modulus may also be used, which is not limited herein. In addition, the strengthening layer 400 needs to be able to withstand bending of 100,000 times or more with a radius of 1 mm-15 mm.

In specific implementation, in the above flexible display module provided by the embodiment of the present disclosure, the transmittance of the strengthening layer 400 is greater than 90%, so that the added strengthening layer 400 does not affect the normal display of the flexible display module.

In specific implementation, in the above flexible display module provided by the embodiment of the present disclosure, the strengthening layer 400 may be fixed to an adjacent layer by a glue material. In addition, the other layers in the flexible display module provided in the embodiments of the present disclosure, that is, the protective layer 300, the display layer 200, the polarizing layer 500 and the touch layer 600, may be fixedly connected to each other by a glue material.

The structure shown in FIG. 3c is taken as Example 1, the structure shown in FIG. 3f is taken as Example 2, the structure which is similar as that shown in FIG. 3c but without the strengthening layer 400 is taken as Comparative Example 1, and the structure which is similar as that shown in FIG. 3f but without the strengthening layer 400 is taken as Comparative Example 2, respectively, the bending test and ball drop test are performed, and the results are shown in the following Table 1.

TABLE 1

|  | Bend 100,000 times with radius of 3 mm | Bend 100,000 times with radius of 5 mm | 0.1 J of ball drop impact energy | 0.2 J of ball drop impact energy |
| --- | --- | --- | --- | --- |
| Example 1 | OK | OK | OK | OK |
| Example 2 | OK | OK | OK | OK |
| Comparative Example 1 | OK | OK | NG | NG |
| Comparative Example 2 | OK | OK | NG | NG |

Wherein, the ball drop test method used is described as follows.

The flexible display module is placed with the display surface facing upwards and then firmly fixed in a specific area of the sample stage. During the test, in order to protect the flexible printed circuit (FPC) and the driving part from being damaged by the heavy ball, the edge of the FPC of the flexible display module and the driving IC end should be fixed outside the falling range of the heavy ball. A steel ball with mass of 32.65 g and diameter of 20 mm free falls from a certain height and arrives at different parts of the window area of the flexible display module. After each one point is tested, the appearance and mechanical functions of the flexible display module are checked, and electrical functions of the flexible display module are tested. The table of test height and corresponding energy is shown in the following Table 2.

TABLE 2

Table of comparing test energy

| Diameter of steel ball (mm) | ø20 |
| --- | --- |
| Mass of steel ball (g) | 32.65 |

| Impact energy (J) | Corresponding height (cm) |
| --- | --- |
| 0.10 | 31.5 |
| 0.20 | 62.5 |

In the flexible display module and the display device provided by the embodiment of the present disclosure, a strengthening layer is inserted between the display layer and the protective layer, and the modulus of the strengthening layer is greater than or equal to that of any of the layers in the flexible display module, so that the strained neutral layer in the flexible display module is pulled to the vicinity of the strengthening layer. Since the display layer is closer to the strengthening layer, it is less stressed, so that the bending characteristic of the display layer can be enhanced. Thus, the reliability of the flexible display module in the ball drop test is improved while the thickness of the protective layer does not affect the bending characteristics.

It will be apparent to those skilled in the art that various changes and modifications can be made in the present disclosure without departing from the spirit and scope of the present disclosure. In this manner, it is intended that the present disclosure is also accompanied by such variations and modifications if the variations and modifications of the present disclosure are within the scope of the appended claims and the equivalents thereof.

What is claimed is:

1. A flexible display module, comprising: a flexible substrate, a display layer disposed on the flexible substrate, a protective layer disposed on the display layer, a strengthening layer disposed between the display layer and the protective layer, modulus of the strengthening layer being greater than or equal to modulus of any of the layers in the flexible display module, the strengthening layer needs to be able to withstand bending of 100,000 times or more with a radius of 1 mm-15 mm, modulus of the strengthening layer ranges from 10 Gpa to 200 Gpa, and material of the strengthening layer is inorganic fiber-reinforced organic material.

2. The flexible display module according to claim 1, further comprising a polarizing layer disposed between the display layer and the protective layer.

3. The flexible display module according to claim 2, further comprising a touch layer disposed between the polarizing layer and the protective layer.

4. The flexible display module according to claim 2, wherein the strengthening layer is adjacent to the display layer.

5. The flexible display module according to claim 1, wherein thickness of the strengthening layer ranges from 10 µm to 150 µm.

6. The flexible display module according to claim 5, wherein the thickness of the strengthening layer ranges from 30 µm to 120 µm.

7. The flexible display module according to claim 6, wherein the thickness of the strengthening layer ranges from 30 µm to 100 µm.

8. The flexible display module according to claim 1, wherein transmittance of the strengthening layer is greater than 90%.

9. The flexible display module according to claim 1, wherein the strengthening layer is fixed to an adjacent layer by a glue material.

10. A display device comprising the flexible display module according to claim 1.

11. The flexible display module according to claim 2, further comprising a touch layer disposed between the polarizing layer and the display layer.

12. The flexible display module according to claim 3, wherein the strengthening layer is adjacent to the display layer.

13. The flexible display module according to claim 2 wherein thickness of the strengthening layer ranges from 10 µm to 150 µm.

14. The flexible display module according to claim 3 wherein thickness of the strengthening layer ranges from 10 µm to 150 µm.

15. A display device comprising the flexible display module according to claim 2.

16. A display device comprising the flexible display module according to claim 3.

* * * * *